United States Patent [19]

Angelbeck et al.

[11] 4,163,980

[45] Aug. 7, 1979

[54] RECORDING ELECTRODE ASSEMBLY FOR USE IN ELECTROSTATIC REPRODUCTION

[75] Inventors: Rolf Angelbeck, Kiel; Reinhard Gesell, Schonkirchen; Rüdiger Sommer, Raisdorf, all of Fed. Rep. of Germany

[73] Assignee: Firma Dr. -Ing. Rudolf Hell GmbH, Kiel, Fed. Rep. of Germany

[21] Appl. No.: 845,609

[22] Filed: Oct. 26, 1977

[30] Foreign Application Priority Data

Oct. 26, 1976 [DE] Fed. Rep. of Germany ....... 2648298

[51] Int. Cl.² .......................................... G03G 15/048
[52] U.S. Cl. .......................... 346/155; G01D/15/06
[58] Field of Search ............ 346/155, 162, 163, 139 C

[56] References Cited

U.S. PATENT DOCUMENTS

| 3,267,485 | 8/1966 | Howell | 346/155 |
|---|---|---|---|
| 3,618,118 | 11/1971 | Lloyd | 346/155 |
| 3,624,661 | 11/1971 | Shebanow | 346/155 |
| 3,827,056 | 7/1974 | Vano | 346/165 |
| 3,893,128 | 7/1975 | Bäuerlen | 346/155 |
| 4,082,619 | 4/1978 | Dehnert | 346/165 |

OTHER PUBLICATIONS

IBM Tech. Discl. Bulletin, vol. 20, No. 10, Mar. 1978, p. 3924, "Lamenated Ceramic Electro-Erosion Print Head" Humenik et al.

Primary Examiner—Jay P. Lucas
Attorney, Agent, or Firm—Ernest F. Marmorek

[57] ABSTRACT

A recording device for use in electrostatic reproduction of an image on a recording medium includes a support, two carrier plates juxtaposed relative to each other on the support, covers for the carrier plates, a row of electrodes near one side of each carrier plate, supply leads for the electrodes near each carrier plate on its other side, a plurality of counter electrodes spaced apart from the electrodes, and an insulating layer between the carrier plates. The electrodes and counter electrodes define a gap adapted for the passage of the recording medium.

5 Claims, 4 Drawing Figures

RECORDING ELECTRODE ASSEMBLY FOR USE IN ELECTROSTATIC REPRODUCTION

BACKGROUND OF THE INVENTION

The invention relates more particularly to a recording device for the electrostatic reproduction of an image including a comb of electrodes, counter electrodes and supply leads for the electrodes, the comb of electrodes including at least two rows of electrodes insulated from another, which are disposed as conductive tracks on a carrier plate.

In the technique for facsimile reproduction, an image is scanned in a scanning device dot-by-dot and line-by-line, by means of a photo-electric scanning member, and the brightness information of the image dots is transformed into an electric image signal.

The image to be copied may be a printed or typewritten document, a handwritten text, or also a graphical illustration.

In a known recording apparatus the image signal controls a recording member, which in the case of an electrostatic reproduction, consists of a comb of electrodes and a plurality of counter electrodes. Between the comb of electrodes and the counter electrodes there passes a recording medium, which is composed of a base layer of medium conductivity, and of a dielectric layer facing the comb of electrodes.

Electrostatic recording is effected by transferring point charges to the dielectric layer of the recording medium, the point charges being created by a spark discharge between an electrode and the associated counter electrode.

On the recording medium there is created an electrostatic charge pattern, which corresponds to the information scanned from the image.

Following recording, the latent charge image is developed by application of toner materials, and changed to a visible image, which may be fixed, for example, by heat treatment. The developed and fixed recording medium is the desired copy of the image.

The comb of electrodes of the recording medium includes a multiplicity of individual electrodes. In order to obtain a high degree of printing density and a fine resolution during recording, the individual electrodes are disposed closely to one another. However, they must be insulated from one another so that the electrodes can be selectively controlled.

The comb of electrodes preferably includes two parallel rows of electrodes insulated from one another, which extend over the whole width of the recording medium. The electrodes of one row are aligned very precisely with respect to the separation distance of two respective electrodes of the other row. Precise positioning of the electrodes with respect to one another is necessary, so as to obtain, during recording of the copy, a homogeneous printing density in a plane, freedom from streaking and clean contours, in other words, a good quality of reproduction.

The counter electrodes disposed in another row extend also over the whole recording width. Each counter electrode is precisely aligned with a group of electrodes.

In order to create the necessary potential difference for a spark discharge, the electrodes and counter electrodes are fed by high voltage generators. Formation of these connections poses a particular problem when manufacturing the recording medium.

In German patents DT-OS No. 2 260 227, and DT-OS No. 2 261 529, there is already described a comb of electrodes, where the electrodes consist of individual wires embedded in plates of artificial resin.

In a comb of electrodes of this type, each electrode must be connected manually in a time consuming manner to an appropriate supply lead.

A comb of electrodes is known from German patent DT-OS No. 2,023,719, in which the electrodes are fabricated from conductive tracks on both sides of an insulating plate. The starting point therefor is a so-called doubly packed or lined foil, which is also used for printed circuits. This comb of electrodes also has the decided disadvantage, that the supply leads must be connected manually.

As there are a large number of electrodes in a comb of electrodes, the supply leads form a thick bundle of leads, which takes up a lot of space and is very difficult to manipulate or form.

A further disadvantage is due to the fact that in the aforesaid method of connection between the electrodes and the output circuit a replacement of the comb of electrodes is very time consuming and costly. Similar problems also arise for the arrangement of counter electrodes.

It is therefore one of the objects of the present invention to obviate these disadvantages, and to devise an electrostatic recording device having electrode- and counter-electrode means which is considerably simpler in construction, and which can be easily manufactured.

SUMMARY OF THE INVENTION

One of the principal objects of the invention is accordingly a recording device, for use in electrostatic reproduction of an image on a recording medium, which includes a support, at least two carrier plates juxtaposed relative to each other on the support, and wherein each carrier plate includes near one side a row of electrodes, and near at least the other side supply leads for the electrodes. Each electrode is insulated from the other electrode, and a plurality of counter electrodes are spaced apart from the electrodes and define therewith a gap adapted for the passage of the recording medium. An insulating layer is disposed between the carrier plates to insulate the electrodes of the two plates from each other, and the support includes covers for the carrier plates.

In one version of the invention the rows of electrodes face one another, and the carrier plates, the insulating layer and the cover plates are adhesively connected to one another, preferably by being gluded to one another.

It is advantageous if the electrodes of each row of electrodes are spaced from one another by a predetermined distance, and if insulating means are provided for insulating the electrodes from one another, which insulating means are disposed at the predetermined distances.

The supply leads are preferably connected to the electrodes through their respective carrier plates and there is preferably secured a projection to at least one of the carrier plates extending therebeyond, the supply leads being disposed on the projection.

The supply leads on each carrier plate are preferably formed as a control matrix for coincidence control of the electrodes.

The device preferably includes a second support, a second carrier plate supported on the second support, and wherein the counter electrodes are formed on the second carrier plate as conductive tracks.

Each conductive track preferably includes a contact surface, a supporting surface, a strip connected between the contact and supporting surface, and a feed connection connected to the supporting surface; the second support preferably supports the second carrier plate within a region of the supporting surface.

It is advantageous if the second projection is secured to, and extends beyond the second carrier plate, and wherein the feed leads are disposed on the second projection.

Each of the rows preferably has a predetermined direction, and each of the contact surfaces is preferably shaped so as to make contact with the recording medium substantially along the predetermined direction.

It is preferable if each carrier plate is formed as a flexible material.

The device preferably includes a plurality of springs, and each of the springs is supported by the second support.

The supply and feed leads are preferably formed as contact tongues on respective projections. The contact tongues are advantageously formed as plug-in connection for a control circuit.

In another version of the invention the supply leads face one another.

The insulating layer is preferably an adhesive layer, and adjacent electrodes of each row are preferably spaced from one another by a predetermined distance, the electrodes of one of the rows being displaced from the electrodes of the other of the rows by one half the spacing between adjacent electrodes.

The constructional features outlined above permit the manufacture of a recording device which is considerably simpler and can be manufactured at a lower cost than conventional devices of this type.

BRIEF DESCRIPTION OF THE DRAWINGS

For a fuller understanding of the nature and objects of the invention, reference should be had to the following detailed description, taken in connection with the accompanying drawings in which.

DESCRIPTION OF THE PREFERRED EMBODIMENTS

Figure 1:
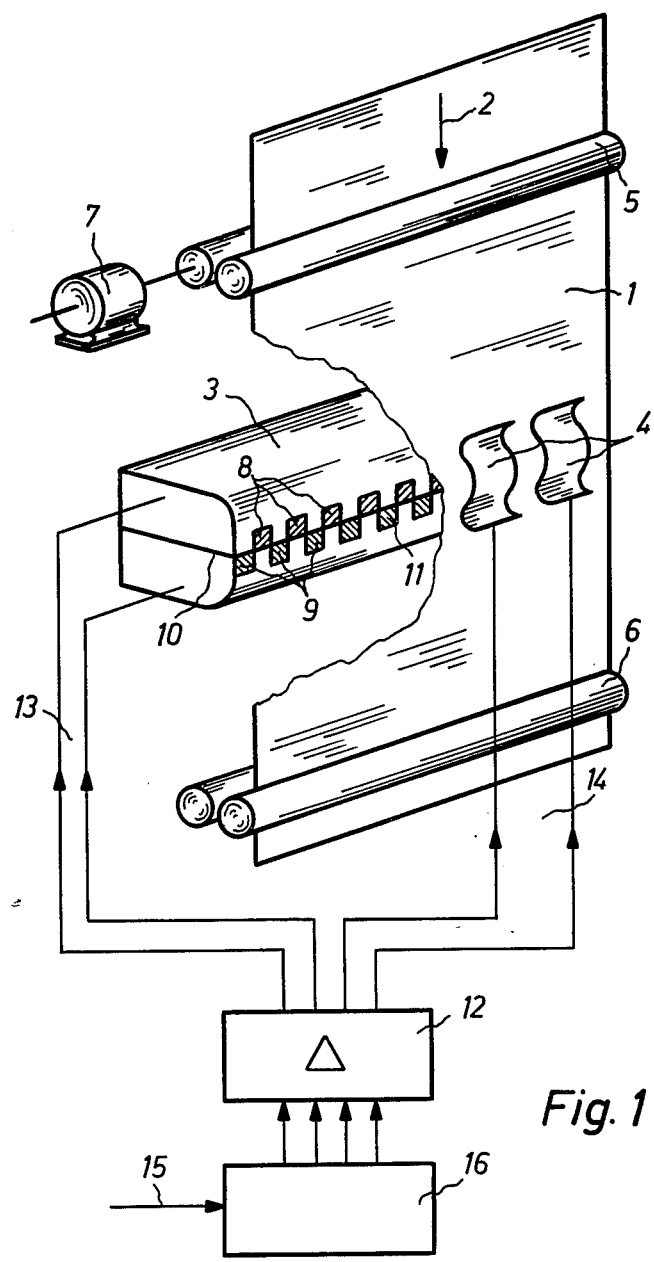
FIG. 1 shows a basic construction of a facsimile recording device having an electrostatic recording member.

In carrying the invention into effect, and referring now particularly to FIG. 1, the recording medium 1 moves in the direction of an arrow 2 between a comb of electrodes 3 rigid with the device, and counter electrodes 4 opposite to the comb of electrodes 3. The recording medium 1 includes a base layer of medium conductivity, and a dielectric layer facing the comb of electrodes 3 for storing the point charges. The advancement of the recording medium 1 is accomplished by means of rollers 5 and 6. One of the rollers, for example the roller 5, is driven by means of a motor 7. The comb of electrodes 3 includes two rows of electrodes 8 and 9, which extend over the whole width of the recording medium 1, and are separated from one another by an insulating layer 10.

In order to achieve a uniform thickness of printing, the electrodes of one row aligned precisely with respect to the distance separating two electrodes, respectively, of the other row. The operating surface of each electrode is preferably square.

In an actual implementation example the recording carrier has a width of 216 mm. Using the standard number of 8 electrodes per millimeter of recording width (CCITT—Proposal), the total number of electrodes, which are uniformly distributed between the rows of electrodes 8 and 9 is equal to 1728.

The counter electrodes 4 also extend over the whole width of the recording medium 1. The contact surface of the counter electrode 4 is formed so that it makes contact with the recording medium 1 at two points, a hollow space being formed within the region of the row of electrodes 8 and 9 of the comb of electrodes 3.

An electrostatic recording is made by transferring the point charges to the dielectric layer of the recording medium 1. The point charges arise due to a spark discharge in view of the high potential difference between one of the electrodes 11 and an associated counter electrode 4.

In order to record a line at right angles with respect to the advancement of the recording medium 1, selected electrodes of one row are first activated, and then the corresponding electrodes of the other row are activated, if the already transferred charges of that line are below the other row of electrodes.

A plurality of high-voltage amplifiers in the high-voltage generator 12 generate the necessary high voltages required for causing a spark discharge, these being supplied to the comb of electrodes 3 through the multiple supply leads 13, and to the counter electrodes 4 through the multiple supply leads 14. In order to be able to use a lower number of high-voltage amplifiers than a number corresponding to the total number of electrodes of the comb of electrodes 3, the activation of the electrodes is accomplished by means of a control matrix according to the coincidence principle, which is described in detail in German patents DT-OS No. 2,162,629, and DT-OS No. 1,946,815.

For this purpose the rows of electrodes 8 and 9 are subdivided into adjacent groups having n electrodes in each group, which are numbered consecutively from 1 to n. Electrodes of the same number are connected to respective high-voltage amplifiers via a control matrix, not illustrated in FIG. 1, so that the number of the required high-voltage amplifiers is reduced from m times n to n.

The selection of the high-voltage amplifiers is accomplished during a recording by control signals, which are generated in a calculator or computer 16 from a digital image signal obtained from a non-illustrated scanner, the image having been converted to a parallel output by a serial-to-parallel-conversion.

The construction of the comb of electrodes 3 and of the counter electrodes 4 will now be described in greater detail. The carrier plates 19 and 20 illustrated in FIG. 2 form the starting point for the comb of electrodes 3, the carrier plates 19 and 20 being made of insulating material. On the side of the carrier plate 19 visible in FIG. 2, there are disposed the row of electrodes 8 in the form of conductive tracks, while the row of electrodes 9 is disposed on the other carrier plate 20.

Figure 2:
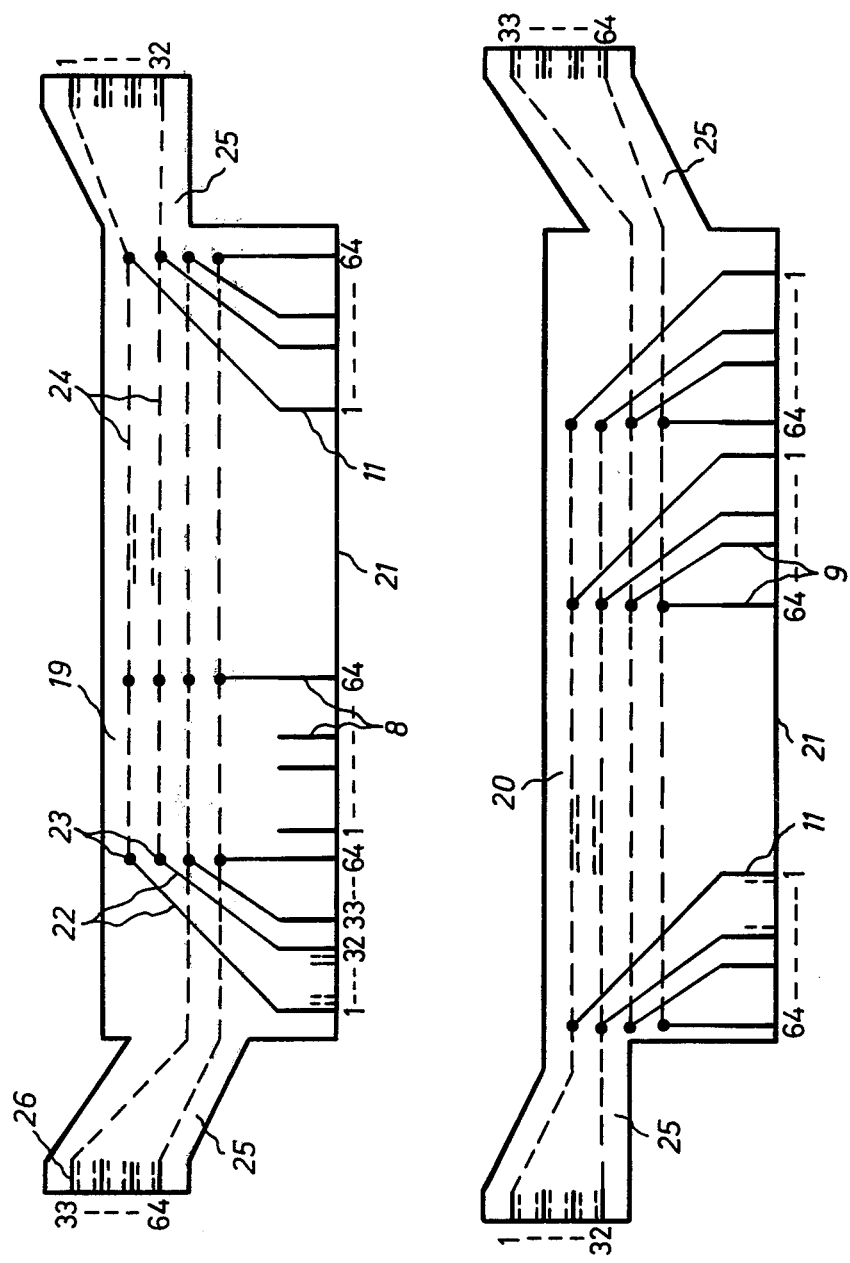
FIG. 2 shows one version of the carrier plates.

On those sides of the conductive or carrier plates 19 not visible in FIG. 2 and which have therefore been shown as dashed lines, there are disposed respective control matrices for coincidence control of the electrodes 11, which have also the shape of conductive tracks. The electrodes 11 of one row are displaced with respect to those of the other row by one half the center to center distance of two adjacent electrodes. The electrodes have preferably a square-shaped cross section. The cross sections of the electrodes 11 bordering the longitudinal edges 21 of the carrier plates 19 and 20 form the operating surfaces of the comb of electrodes 3.

In the implemention example selected each row of electrodes 8 and 9 consists of 864 individual electrodes. The lengths of each square of an electrode 11 is approximately 115 micrometers.

Each row of electrodes 8 and 9 is subdivided for the purpose of coincidence control or activation into 13½ groups having 64 and 32 electrodes, respectively, and each group is further subdivided into two equal subgroups. The electrodes in each group are successively numbered from 1 to 64.

In view of the exceedingly small dimensions, the conductive tracks in FIG. 2 are only shown schematically, there being shown only three groups for a row of electrodes, and within one group only the first and last electrode of each sub-group is shown.

The electrodes 11 are connected by conductive tracks or conducting rails 22 to contact points 23 bearing the same reference numerals, which form the electric connections to the parallel conducting rails 24 of the control matrix on the reverse sides of the carrier plates 19 and 20 through a respective one of the carrier plates.

The conducting rails 24 of the control matrix terminate at four projections 25 of the carrier plates 19 and 20, respectively, and are formed in the shape of contact tongues 26.

Figure 3:
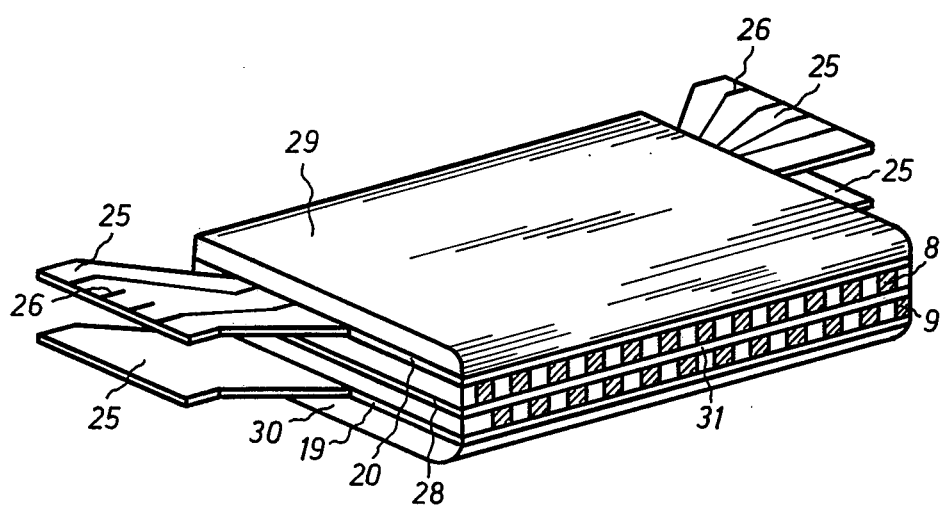
FIG. 3 shows the construction of the comb of electrodes.

FIG. 3 shows the construction of a comb of electrodes 3. It includes the carrier plates 19 and 20 provided with conducting rails according to FIG. 2, which are superimposed with the respect to one another, so that the rows of electrodes 8 and 9 face one another. An insulating foil 28 is disposed between the carrier plates 19 and 20, the insulating foil 28 determining the distance between the two electrodes rows. Respective cover plates 29 and 30 are disposed above and below the carrier plates 19 and 20.

All parts are, for example, glued to one another under pressure. The adhesive material is also disposed in the spaces between the electrodes, resulting in the electrodes being insulated from one another. The insulating foil 28 may be dispensed with, if a suitable glue has been applied between the carrier plates 19 and 20. The front side of the comb of electrodes is polished, in order to obtain a rounded and smooth operating surface 31.

The size of the cover plates 29 and 30 is so selected the the projections 25 project from the device. Non-illustrated ledges of a sleeve disposed in a cable tree provide for a rapidly connectable and disconnectable electrical connection between the electrodes and a control circuit in an advantageous manner.

Figure 4:
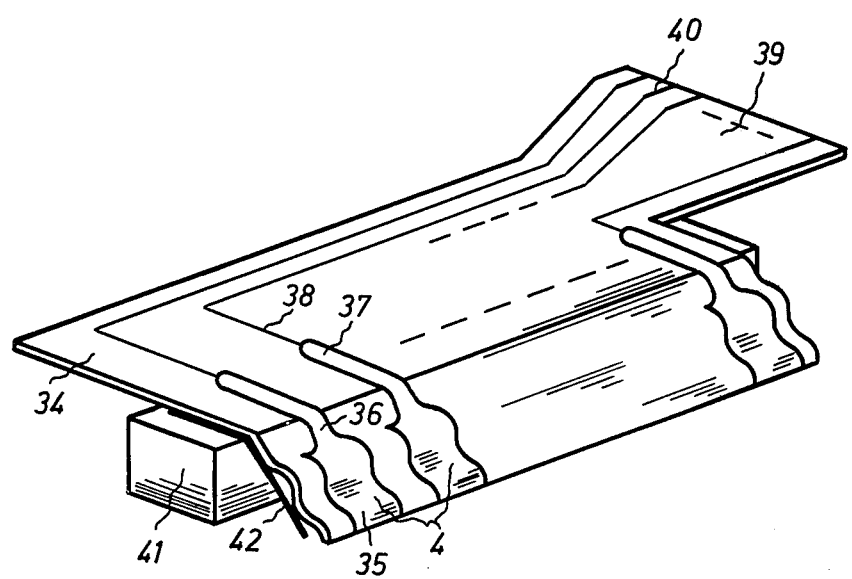
FIG. 4 shows the arrangement of the counter electrodes.

In an advantageous implementation the carrier plates 19 and 20 are made of a flexible material, for example, of a thin foil of epoxy resin. In this case the plug-type contacts of the projections 25 of the comb of electrodes 3 may be bent and connected to a corresponding socket of the control circuit without requiring any flexible leads. In FIG. 4 there is shown an arrangement of counter electrodes with a shaped carrier plate 34, on which there is disposed a row of the counter electrodes 4 in the shape of conducting rails.

The conducting rail or track of a counterelectrode 4 consists of a contact surface 35, a strip 36, a supporting surface 37 and a supply lead 38, a contact tongue 40 being formed on a projection 39. Each contact surface 35 of the counterelectrodes 4 is so shaped, so that two contact surfaces result with a recording medium, such as recording medium 1. The carrier plate 34 is secured to a support 41 within a region of the supporting surface 37. Appropriately formed springs 42, which are disposed between a holder 41 and the carrier plate 34, support each contact surface 35, and ensure an elastic fit of the counterelectrode 4 to the recording carrier.

We wish it to be understood that we do not desire to be limited to the exact details of construction shown and described, for obvious modifications will occur to a person skilled in the art.

A modification which will be in the scope of invention which is not illustrated but easily deducible from FIG. 3 is a mounting of the layers in the same sequence as illustrated in FIG. 3, but with the difference that the carrier plates 19 and 20 bearing the electrodes 8 and 9 are respectively mounted in an inverse position so that the carrier plates 19 and 20 contact the layer 28.

Having thus described the invention, what we claim as new and desire to be secured by Letters Patent, is as follows:

1. A recording device for use in electrostatic reproduction of an image on a recording medium including an electrode arrangement comprising in combination:
    at least two insulating carrier plates, each carrying on one surface thereof a plurality of separate electrodes arranged in a row, and on the opposite surface thereof a plurality of electrical leads, said rows being substantially parallel to one another, and extending in a predetermined direction,
    at least one end of each of said electrical leads being constructed as a contact tongue for plug-in connection, said electrical leads being formed as a control matrix for coincidence control of said electrodes, so that the number of said contact tongues is smaller than the number of said electrodes, said plurality of electrodes being connected to said control matrix through a corresponding one of said carrier plates,
    an insulating layer disposed between said carrier plates,
    a cover plate for each of said carrier plates, said carrier plates, said insulating layer and said cover plates being connected to one another,
    a plurality of counter-electrodes, arranged along said predetermined direction, spaced apart from said electrodes, and defining therewith a gap adapted for the passage of the recording medium,
    a support for said counter-electrodes, and
    an additional carrier plate mounted on said support, said counter-electrodes being formed as conductive tracks on said additional carrier plate, each of said counter-electrodes including
    a contact surface adapted to contact said recording medium,
    a strip electrically connected to said contact surface,
    a supporting surface electrically connected to said strip, an electrical supply lead connected with one end thereof to said supporting surface, and a further contact tongue connected to the other end of said electrical supply lead.

2. A recording device according to claim 1, including a further projection secured to, and extending beyond said additional carrier plate, said further contact tongues of said leads being disposed on said further projection.

3. A recording device according to claim 1, wherein each of said contact surfaces of said counter-electrodes is shaped so as to make dual contact with the recording medium in a direction transverse to the direction of said rows of electrodes.

4. A recording device according to claim 1, further comprising a plurality of springs, each of said springs being supported by said support and by one of the contact surfaces of said counter-electrodes, so as to ensure an elastic fit of said counter-electrodes to said recording medium.

5. A recording device according to claim 1, wherein said further carrier plate is formed of a flexible material.

* * * * *